United States Patent [19]

Dietrich et al.

[11] Patent Number: 5,596,300

[45] Date of Patent: Jan. 21, 1997

[54] METHOD AND ARRANGEMENT FOR DETERMINING PHASE CHANGES OF A REFERENCE INPUT SIGNAL OF A PHASE-LOCKED LOOP

[75] Inventors: Werner Dietrich; Christian Jenkner, both of Vienna, Austria

[73] Assignee: Siemens Aktiengesellschaft, Munich, Germany

[21] Appl. No.: 553,066

[22] Filed: Nov. 3, 1995

[30] Foreign Application Priority Data

Nov. 28, 1994 [DE] Germany .................. 44 42 306.3

[51] Int. Cl.$^6$ ................ H03L 7/06; H03L 7/08; G01R 23/00; G06F 17/00
[52] U.S. Cl. ................ 331/17; 331/14; 331/18; 331/49; 327/156; 327/292; 364/481; 364/484
[58] Field of Search ................ 331/1 A, 10, 14, 331/17, 18, 25, 44, 49, DIG. 2; 327/2, 3, 5, 39, 40, 42, 156–159, 292, 298; 364/481, 484

[56] References Cited

U.S. PATENT DOCUMENTS 5,260,979 11/1993 Parker et al. .................. 331/18 X

FOREIGN PATENT DOCUMENTS

0262481A2 6/1988 European Pat. Off. .

OTHER PUBLICATIONS

Telcom Report 9 (1986) vol. 4, "Neue Taktgeneratoren für EWSD", pp. 263–269. Ernst, W. et al.

*Primary Examiner*—David Mis
*Attorney, Agent, or Firm*—Hill, Steadman & Simpson

[57] ABSTRACT

A processor (PR) is connected to the output of a phase comparator (PK) in a phase-locked loop. The processor (PR) calculates the phase shift of an input signal ($f_E$) within an observation time span (for example, $\Delta t = 0-T$) from the phase difference ($\Delta\phi$) at the output of the phase comparator (PK) and the parameters of the phase-locked loop (FT1, PK, FI, VCO, FT2).

9 Claims, 1 Drawing Sheet

METHOD AND ARRANGEMENT FOR DETERMINING PHASE CHANGES OF A REFERENCE INPUT SIGNAL OF A PHASE-LOCKED LOOP

BACKGROUND OF THE INVENTION

The present invention is directed to a method and apparatus for determining phase changes of a reference input signal of a phase-locked loop.

Network clock reference signals are required at switching centers and network nodes in synchronous, digital communication networks. Especially high demands are made of reference frequencies with respect to stability for reliable transmission of data. In the prior art the required long-term stability can only be guaranteed with cesium atomic frequency normals.

For reasons of economic feasibility, clock generators synchronized by a national frequency normal are employed in digital communication networks. In what are referred to as slave equipment, the clock signal is recovered from the transmitted signals by synchronization of the clock generator. The desired, phase-locked coupling of the clock signals in the synchronous system, however, can be negatively influenced by this type of clock generating. Given the phase-locked loops (PLL) usually employed, the basic principle applies that the coupling between input signal and output clock signal becomes more rigid at higher limit frequencies. On the other hand, the regenerator equipped with the PLL circuit must switch into what is referred to as memory mode and itself supply an optimally frequency-exact clock signal given outage of the synchronizing signal, for example due to a disturbed transmission link. The stability of this clock, however, increases for lower limit frequency of the phase-locked loop. For this reason, clock generators having different limit frequencies are employed for synchronization. In order for a regenerator to switch into memory mode in which it supplies a stable clock, it is first necessary to determine and check the constancy of the incoming signal. Given fast and relatively large frequency changes, a phase difference can be determined by comparing the input signal to the regenerated output signal at constant time intervals and the frequency deviation can be in turn determined from this phase difference. Frequency deviations greater than approximately $10^{-7}$ can be recognized on the basis of these methods. The determination of smaller frequency deviations becomes more difficult when the necessary observation times must be selected longer. In these cases, the output clock signal in the PLL control circuit follows the input signal and can no longer be considered fixed.

One possibility for determining small phase or, respectively, frequency changes is to employ separate, highly constant reference oscillators that are independent of a reference signal. What is disadvantageous about this proposal are the additional costs for an oscillator that provides the required constant frequency.

SUMMARY OF THE INVENTION

It is an object of the present invention to provide a method and apparatus for determining phase changes at the input of a PLL circuit.

In general terms the present invention is a method for determining a change in a phase of a reference input signal of a phase-locked loop that has at least one phase comparator, a filter and a controlled oscillator. The method has the steps of: providing a reference input signal to the comparator; and calculating a phase shift of the input signal within an observation time span in a processor from a phase difference at an output of the phase comparator and parameters of the phase-locked loop.

In two different embodiments the phase shift is calculated in the processor from the phase difference using two different formulas, respectively.

In an advantageous development of the present invention the frequency deviation of the reference input signal is calculated from the shift of the phase. A control signal is output by the processor when the shift in the phase of the reference input signal exceeds a predetermined value. A switch is made to a standby reference input signal as a result of the control signal or a reference average value supplied to the oscillator given a sectional phase-locked loop.

In general terms the present invention is also an arrangement for determining a change in a phase of a reference input signal of a phase-locked loop. The phase-locked loop has at least one comparator having first and second inputs and an output. A filter has an input connected to the output of the comparator and has an output. A controlled oscillator has an input connected to the output of the filter and has an output. A processor is connected to the output of the phase comparator. The processor calculates the phase shift of the input signal from a phase difference at the output of the phase comparator and parameters of the phase-locked loop and outputs a control signal at its control output.

In an advantageous development of the present invention a first switch is provided in the path of the reference input signal. At least one standby reference signal pends at an input of the first switch. When a limit value is upwardly transgressed, a switch is made to the standby reference signal. A second switch having a second input is provided. A first input of the second switch is connected to the output of the phase comparator and an output of the second switch is connected to the filter. A reference average value calculated in the processor is conducted to a second input of the second switch. Given an upward transgression of a limit value corresponding to a predetermined phase shift of the reference input signal, a switch is made to a reference average value calculated in the processor.

The advantage of the present inventive method is simplicity. A comparison oscillator is not required.

The calculation of the phase shift is the input signal (from which the frequency deviation can in turn be calculated), ensues on the basis of the mathematical relationships between the signals and the parameters of the control loop. The mathematical operations can be calculated by an analog calculating circuit or by a digital arithmetic unit or, respectively, a processor. Combinations thereof are likewise possible.

The determination of the time interval over the phase deviation or, respectively, of the corresponding sum in a digital hardware integrator and the execution of the final calculation in a processor are advantageous. Calculation of the parts and the double interval can thereby often be eliminated since this is negligible given high attenuation values.

The input signal is considered faulty as soon as the identified value for the phase deviation of the input signal upwardly transgresses a predetermined limit value and a different reference signal or a rated value is supplied to the oscillator for frequency control.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
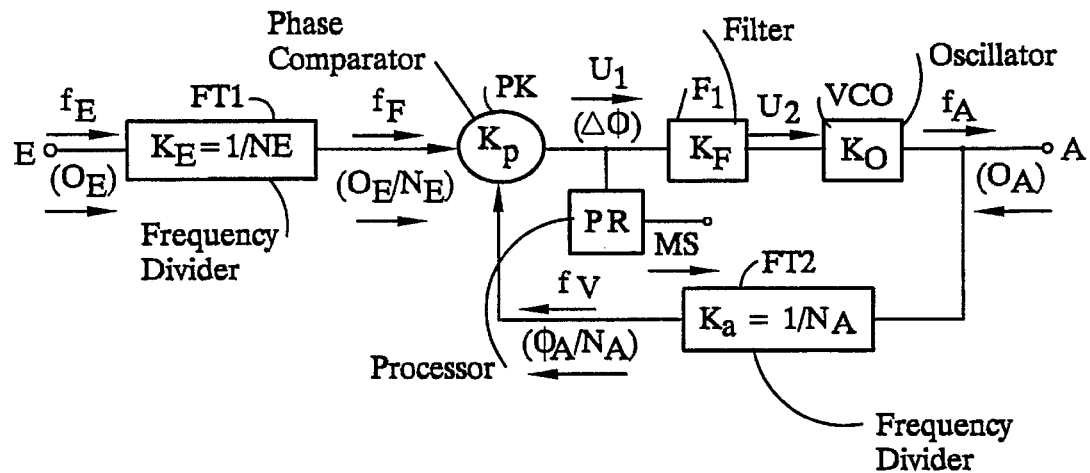
FIG. 1 is a fundamental circuit diagram of a phase-locked loop.

FIG. 1 shows a phase-locked loop. It contains an input frequency divider FT1 to which an input signal $f_E$ is supplied and that outputs a pilot signal $f_F$. It also contains a phase comparator PK whose first input is connected to the output of the input frequency divider FT1. A filter FI that is connected to the output of the phase comparator and PK outputs a control signal U2 for the oscillator VCO. The oscillator VCO generates the output signal $f_A$ that is output at the output A. The phase locked loop also has an output frequency divider FT2 that divides down the frequency of the output signal and supplies it as comparison signal $f_V$ to a second input of the phase comparator PK. The phase comparator PK outputs the current phase difference $\Delta\phi$ as output signal U1. Identical reference characters have been selected as signal designations and frequency particulars since only the frequencies are relevant for the phase-locked loop.

The frequency dividers FT1 and FT2 are not required when the oscillator frequency $f_A$ coincides with the frequency of the input signal $f_E$. An output frequency that is higher than the input frequency is often also generated using the second frequency divider that is required for the operation of the device.

A processor PR is also connected to the output of the phase comparator. The processor PR calculates the change of the phase $\phi_E$ of the pilot signal $f_F$ at the input of the phase comparator or of the reference input signal $f_E$ at the input of the potentially preceding input frequency divider FT1. When required, the phase comparator PK can calculate the phase changes of these signals therefrom and can also implement comparisons to limit values. The result can be used as control signal MS, for example for switching to other reference signals, or can be registered for monitoring purposes.

The function of the PLL circuit is known from numerous publications and text books. It functions as a phase control loop that sets the comparison frequency $f_V$ at the phase comparator by controlling the oscillator VCO such that it exactly coincides with the frequency of the pilot signal $f_F$ that is received by the phase comparator and is generated by a pilot oscillator or is derived therefrom, so that the phase deviation at the output of the phase comparator is constant.

Both the frequencies of the signals, the average of the input voltage and the output voltage of the filter as well as the corresponding phases of the signals for the tuned-in condition of the phase-locked loop are shown in FIG. 1 in what is referred to as LaPlace or image presentation:

$U_1$ input voltage of the filter,
$U_2$ output voltage of the filter,
$\phi_E$ input phase,
$\phi_A$ output phase,
$\phi_V = \phi_A/N_A$ comparison signal phase, $\Delta\phi$ phase difference, and the transfer functions of these circuit units:

$K_P$ transfer function of the phase comparator,
$K_F$ transfer function of the filter,
$K_O = K_v/s$ ($K_v$=control steepness) of the oscillator,
$K_E = 1/N_E$ transfer function of the input frequency divider, and
$K_A = 1/N_A$ transfer function of the output frequency divider.

Figure 2:
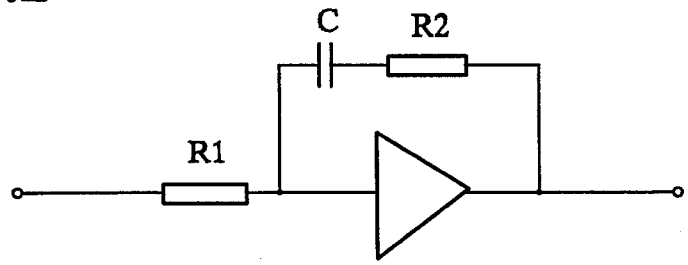
FIG. 2 is an example of an employed filter.

The behavior of the phase-locked loop and the calculation of the input phase shall be described first. An active filter with PI part shown in FIG. 2 is used as regulator FI. A first resistor R1 precedes the input of an amplifier. A second resistor R2 lies in series with a capacitor C between the filter output and the amplifier input.

The calculation can be correspondingly modified for the various filter types and variation of the control loops, for example given lack of input or output divider.

$$\Delta\Phi = \frac{\Phi_E}{N_E} - \frac{\Phi_A}{N_A} \rightarrow \tag{1}$$

$$\Phi_E = N_E \Delta\Phi + \frac{N_E}{N_A} \Phi_A \tag{2}$$

$$U_1(s) = K_P \cdot \Delta\Phi(s) \rightarrow \tag{3}$$

$$U_1(t) = K_P \cdot \Delta\Phi(t) \tag{4}$$

$$K_F = \frac{U_2}{U_1} = \frac{1 + s\tau_2}{s\tau_1} \rightarrow \tag{5}$$

$$U_2(t) = \frac{\tau_2}{\tau_1} U_1(t) + \frac{1}{\tau_1} \int U_1(t) dt \tag{6}$$

with $\tau_1 = R1 \cdot C; \tau_2 = R2 \cdot C$ $$\Phi_A(s) = K_O \frac{U_2(s)}{s} \rightarrow \tag{7}$$

$$\Phi_A(t) = K_O \int U_2(t) dt \tag{8}$$

with (4) and (6) inserted into (8):

$$\Phi_A(t) = K_O K_P \frac{\tau_2}{\tau_1} \int \Delta\Phi(t) dt + K_O K_P \frac{1}{\tau_1} \int dt \int \Delta\Phi(t) dt \tag{9}$$

with $$\omega = \sqrt{\frac{K_O K_P}{\tau_1}} \tag{10}$$

$$\zeta = \frac{\tau_2}{2} \sqrt{\frac{K_O K_P}{\tau_1}} \tag{11}$$

inserted into (9):

$$\phi_A(t) = 2\zeta\omega \int \Delta\phi(t) dt + \omega^2 \int dt \int \Delta\phi(t) dt \tag{12}$$

(12) inserted into (2):

$$\Phi_E(T) = N_E \cdot \Delta\Phi(T) + \tag{13}$$

$$\frac{N_E}{N_A} \left( 2\zeta\omega_n \int_0^T \Delta\Phi(t) dt + \omega_n^2 \int_0^T dt \int_0^T \Delta\Phi(t) dt \right)$$

As indicated in equation (13), the phase of the input signal can be calculated from the phase difference and the parameters of the control loop.

Dependent on the plurality of poles of their transfer function, a distinction is made in phase-locked loops between type 1, wherein a constant phase difference $\Delta\phi_k$ is present between the input signals of the phase comparator in the tuned-in condition, and the above-described type 2 wherein there is no phase difference.

In type 1, this constant phase difference $\Delta\phi_k$ can be taken into consideration by the substitution thereof from the current phase difference $\Delta\phi_1$ and the same calculation as in the case of type 2 can subsequently ensue:

$$\Delta\phi = \Delta\phi_1 - \Delta\phi_k \tag{14}$$

Figure 3:
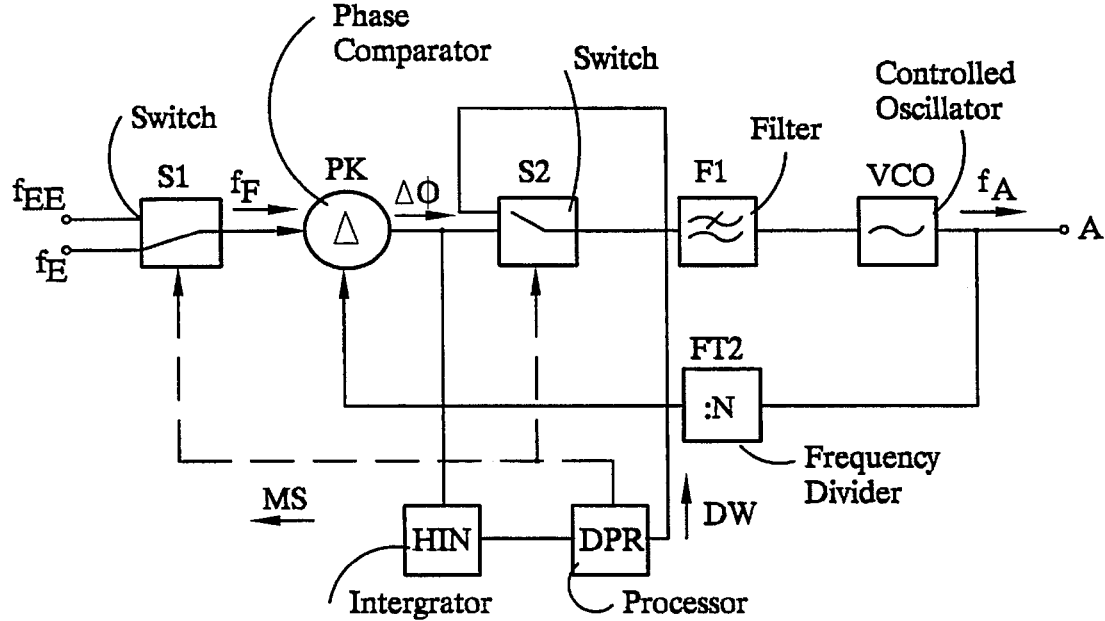
FIG. 3 is a phase-locked loop with switching possibilities.

FIG. 3 shows an exemplary embodiment of the phase-locked loop with switching possibilities to a standby reference signal $f_{EE}$ and a reference average DW. For switching to at least one standby reference signal $f_{EE}$, a first switch S1 is inserted into the signal line of the reference input signal. A second switch S2 whose second input is connected to a data output of the digital processor DPR is inserted preceding the filter FI for switching to the reference average.

For calculating the phase shift, a digital hardware integrator HIN and a digital processor DPR connected thereto are connected to the output of the phase comparator PK.

The hardware integrator HIN converts the output signal of the phase comparator PK, the phase difference $\Delta\phi$, into digital values first (for example, by evaluating the pulse lengths of the binary output signal) and then adds these with every period of the comparison signal or (given slightly limited precision) at respectively only every second or $n^{th}$ period. After a sufficient plurality of values of the phase difference has been summed up, the sum corresponding to the time interval via the phase difference $\Delta\phi$ is transferred after the expiration of an observation time span $\Delta t = 0 - T$ into the digital processor DPR for the calculation of the phase shift. Given application of a cross-connector of the synchronous digital hierarchy, this ensues approximately every second. The integration time is variable.

In, so to speak, time-division multiplex operation, the digital processor can also have longer observation time spans and supply monitoring results at short intervals.

As already initially mentioned, the calculation of the double integral can be often eliminated since this supplies only a small amount given higher attenuations.

When the calculation yields an inadmissible phase shift of the input signal, then this leads to switching to a standby input signal $f_{EE}$ or (if such a signal is not or no longer available) to what is referred to as memory mode wherein the controlled oscillator VCO is supplied with a corresponding, reference average DW of the phase deviation via the second switch S2. This value was calculated in the digital processor and was converted into an analog value given a phase-locked loop operating with analog signals.

The phase and, thus, the frequency constancy of the input signal should be checked even after a switch to memory mode has been undertaken. The processor likewise assumes this task, whereby a constant initial phase difference $\Delta\phi$ between the reference input signal and the average value comparison signal $f_v$ independently defined by the reference forms that basis.

When the check shows that the disturbance of the input signal has passed and the input signal again comprises the required frequency constancy, a switch is made from the memory mode to the adjacent input signal. The check times are variable or, respectively, programmable corresponding to the requirements.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for determining a phase shift in a phase of a reference input signal of a phase-locked loop that has at least one phase comparator, a filter and a controlled oscillator, comprising the steps of: providing a reference input signal to the comparator; calculating a phase shift of the input signal within an observation time span in a processor from a phase difference at an output of the phase comparator and parameters of the phase comparator, the filter and the controlled oscillator of the phase-locked loop.

2. The method according to claim 1, wherein the phase shift of the phase is calculated in the processor from the phase difference according to:

$$\Phi_E(T) = N_E \cdot \Delta\Phi(T) + \frac{N_E}{N_A}\left(2\zeta\omega_n\int_0^T \Delta\Phi(t)dt + \omega_n^2 \int_0^T dt \int_0^T \Delta\Phi(t)dt\right)$$

where $\phi_E$ is the phase, where $\Delta\phi$ is the phase difference, where $\zeta$ is attenuation, where $\omega_n$ is a natural frequency, where $N_A$=division factor of the output frequency divider and where $N_E$=division factor of the input frequency divider of the phase-locked loop within an observation time span $\Delta t = 0 - T$.

3. The method according to claim 1, wherein the phase shift of the phase is calculated in the processor according to:

$$\Phi_E(T) = N_E \cdot \Delta\Phi(T) + \frac{N_E}{N_A}\left(2\zeta\omega_n\int_0^T \Delta\Phi(t)dt\right)$$

where $\phi_E$ is the phase, where $\Delta\phi$ is the phase difference, where $\zeta$ is attenuation, where $\omega_n$ is a natural frequency, where $N_A$=division factor of the output frequency divider and where $N_E$=division factor of the input frequency divider of the phase-locked loop within an observation time span $\Delta t = 0 - T$.

4. The method according to claim 1, wherein a frequency deviation of the reference input signal is calculated from the shift of the phase.

5. The method according to claim 1, wherein a control signal is output by the processor when the shift in the phase of the reference input signal exceeds a predetermined value.

6. The method according to claim 5, wherein a switch is made to a standby reference input signal in response to the control signal or a reference average value supplied to the oscillator given a sectional phase-locked loop.

7. An arrangement for determining a phase shift in a phase of a reference input signal of a phase-locked loop, comprising:

at least one comparator having first and second inputs and an output;

a filter having an input connected to the output of the comparator and having an output;

a controlled oscillator having an input connected to the output of the filter and having an output;

a processor connected to the output of the phase comparator, said processor calculating the phase shift of the input signal from a phase difference at the output of the phase comparator and parameters of the comparator, the filter and the controlled oscillator of the phase-locked loop, said processor having a control output for outputting a control signal.

8. The arrangement according to claim 7, wherein the arrangement further comprises a first switch in the path of the reference input signal, at least one standby reference signal pending at a reference input thereof; and wherein, when a limit value is upwardly transgressed, the first switch is changed to the reference input to receive the standby reference signal.

9. The arrangement according to claim 8, wherein the arrangement further comprises a second switch having a first input connected to the output of the phase comparator, having a second input, and an output connected to the filter; wherein a reference average value calculated in the processor is conducted to the second input of the second switch; and wherein, given an upward transgression of a limit value corresponding to a predetermined phase shift of the reference input signal, the second switch is changed to the second input to receive a reference average value calculated in the processor.

* * * * *